United States Patent [19]

Itozaki et al.

[11] Patent Number: 4,942,142

[45] Date of Patent: Jul. 17, 1990

[54] SUPERCONDUCTING THIN FILM AND A METHOD FOR PREPARING THE SAME

[75] Inventors: Hideo Itozaki; Saburo Tanaka; Nobuhiko Fujita; Shuji Yazu; Tetsuji Jodai, all of Hyogo, Japan

[73] Assignee: Sumitomo Electric Industries Ltd., Osaka, Japan

[21] Appl. No.: 224,699

[22] Filed: Jul. 27, 1988

[30] Foreign Application Priority Data

Jul. 27, 1987 [JP] Japan ................................ 62-186812

[51] Int. Cl.$^5$ .............................................. B32B 9/00
[52] U.S. Cl. ........................................ 505/1; 505/701; 505/702; 505/703; 505/704; 428/413; 428/446; 428/447; 428/473.5; 428/688; 428/689; 428/930; 29/599; 427/62

[58] Field of Search ............................ 505/1, 701–704; 428/688, 930, 447, 446, 413, 473.5, 689; 29/599

[56] References Cited

PUBLICATIONS

Materials and Processing Report, Dec. 1987, MIT, p. 4.

*Primary Examiner*—Patrick Ryan
*Attorney, Agent, or Firm*—Kerkam, Stowell, Kondracki & Clarke

[57] ABSTRACT

An outer surface of a superconducting thin film of compound oxide such as $YBa_2Cu_3O_{7-\delta}$ deposited on a substrate such as MgO and $SrTiO_3$ is protected with a protective layer which is composed of polymer compound such as polyimide, silicon resin or epoxy resin.

12 Claims, No Drawings

SUPERCONDUCTING THIN FILM AND A METHOD FOR PREPARING THE SAME

BACKGROUND OF THE INVENTION

1. Field of the Invention

The present invention relates to a superconducting thin film and a method for preparing the same. More particularly, it relates to a superconducting thin film composed of compound oxide having a high critical temperature and also possessing lasting stability for a long period and a method for preparing the same.

2. Description of the Related Art

The superconductivity is a phenomenon which is explained to be a phenomenon of a kind of phase change of electrons under which the electrical resistance become zero and the perfect diamagnetism is observed. Thus, under the superconducting condition, electric current of a very high current density can be delivered without any loss of power.

Therefore, if the superconducting power cable is realized, the power loss of about 7% which is inevitable in the conventional power cables can be reduced sharply. Realization of superconducting coils which can generate a very high magnetic field is expected to accelerate development in the field of fusion power generation in which the electric power is consumed beyond its output under the present technology, as well as in the field of MHD power generation or motor-generators. The development of superconductivity are demanded also in other industrial fields such as in the field or electric power reservation; in the field of transportation for example magnetic levitation trains, or magnetically propelling ships; in the medical field such as high-energy beam radiation unit; or in the field of science such as NMR or high-energy physics.

In addition to the abovementioned electric power applications, the superconducting materials can be used in the field of electronics, for example, as a device using the Josephson effect in which quantum efficiency is observed macroscopically when an electric current is passed through a weak junction arranged between two superconductors. Tunnel junction type Josephson device which is a typical application of the Josephson effect is expected to be a high-speed and low-power consuming switching device owing to smaller energy gap of the superconducting material. It is also expected to utilize the Josephoson device as a high sensitive sensors or detectors for sensing very weak magnetic field, microwave, radiant ray or the like since variation of electromagnetic wave or magnetic field is reflected variation of Josephson effect and can be observed as a quantum phenomenon precisely. Development of the superconducting devices is also demanded in the field of high-speed computers in which the power consumption per unit area is reaching to the upper limit of the cooling capacity with increment of the integration density in order to reduce energy consumption.

However, the critical temperature could not exceed 23.2K of $Nb_3Ge$ which was the highest Tc for all studies for the past ten years. The possibility of an existence of new types of superconducting materials having much higher Tc was revealed by Bednorz and Müller, who discovered a new oxide type superconductor in 1986 [Z. Phys. B64 (1986) 189]

It had been known that certain ceramics material of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These superconductors, however, possess rather lower transition temperature of about 10K and hence usage of liquidized helium (boiling point of 4.2K) as cryogen is indispensable to realize superconductivity.

The new type compound oxide superconductor discovered by Bednorz and Müller is represented by $[La,Sr]_2CuO_4$ which is called as the $K_2NiF_4$-type oxide having a crystal structure which is similar to known perovskite type oxides. The $K_2NiF_4$-type oxides show such higher Tc as 30K, which are extremely higher than known superconducting materials.

It was also reported that C. W. Chu et al discovered, in the United States of America, another superconducting material so called YBCO type represented by $YBa_2Cu_3O_{7-x}$ having the critical temperature of in the order of 90K in Feb. 1987. Still other type new superconducting materials which were reported recently are a compound oxide of Bi-Sr-Ca-Cu-O system and Tl-Ba-Ca-Cu-O system which exhibit such high Tc as more than 100K and which are chemically mush stable than the abovementioned YBCO type compound oxide or the like.

And hence, the possibility of existence of high-temperature superconductors have burst onto the scene.

The new type superconductor of compound oxide, however, is not stable, and hence their superconductivity is lost or deteriorated with the passing of time. In fact, there is such a tendency that their critical temperature and critical current density drop gradually with the passing of time. This tendency is noticeable in case of a thin film prepared by physical vapour deposition technique. This fact is explained by defectiveness of oxygen deficiency, in other words, imperfect oxygen contents in the crystal. It is known that the superconducting property of compound oxide is influenced by the oxygen contents or oxygen deficiency in their crystalline structures. In order to overcome such drawback, it is usual practice that the deposited thin film prepared by the physical vapour deposition technique is heat-treated or annealed, particularly in the final stage of preparation, under a higher partial pressure of oxygen gas. In fact, if the deposited thin film is not heat-treated, its superconducting property is very poor.

However, even if the deposited thin film is heat-treated, it is impossible to prevent the thin film from deterioration of superconducting property which occur with the passing of time. Such deterioration may be caused by the abovementioned defectiveness of oxygen deficiency resulting from that the compound oxide react with water in air and that oxygen in the crystal escape with the passing of time or so on, so that quasi-stable phase of the superconducting compound oxide is transformed to a non-superconducting phase. The deterioration of superconductivity, in other words a phenomenon that the superconducting property is lost gradually in time is a big problem of compound oxide type superconductors in their actual use.

Therefore, an object of the present invention is to overcome the abovementioned problems of the conventional technique and to provide a superconducting thin film improved in stability during storage or during actual use and a method for preparing the same.

SUMMARY OF THE INVENTION

According to the present invention, an outer surface of a superconducting thin film composed of compound oxide and deposited on a substrate is covered with a protective layer which is composed of polymer compound.

The polymer compound is preferably selected from a group comprising silicon resins, epoxy resin and polyimide resin which are used as a passivation layer in the field of LSI. The polymer compound used in the present invention may be the other type polymer such as diallylphtharate, alkid resin, UV-curable resin or thermosetting resins which are used for packaging of IC.

These polymer compounds can produce a high density protective film layer, so that they can suppress liberation of oxygen from the crystalline superconducting thin film and hence they can advantageously maintain the superconducting property of the thin film for a long time. Still more, they do not exert any bad influence upon the superconducting thin film, since they are chemically stable and can be prepared on the superconducting thin film layer at a lower temperature such as room temperature.

The protective film layer of polymer compound can be prepared by the conventional coating technique such as spin coating, dipping, spraying or the like with solvent. The protective film layer of polymer compound can be prepared by applying directly molten polymer without solvent onto a surface of the superconducting thin film. In a special case, the protective layer of polymer can be formed directly by means of a transfer molding machine.

During formation of the protective layer of polymer compound, the substrate should be maintained at a temperature which is lower than 500° C. In fact, if the thin film deposited is heated at a temperature which is higher than 500° C., oxygen in the crystal of the superconducting thin film is apt to be lost to deteriorate the superconductivity. Therefore, the temperature of the substrate during and/or after the formation of the protective layer should be kept lower than 500° C. Usually, the substrate is not heated higher than a curing temperature of the polymer when the protective layer is deposited.

According to the present invention, more than two protective layers may be formed successively on the superconducting thin film layer. Each protective layer may be different in type and in composition from adjacent layers.

The superconducting thin film can be composed of compound oxide of an element $\alpha$ selected from IIa group of the Periodic Table, an element $\beta$ selected from IIIa group of the Periodic Table, at least one element $\gamma$ selected from a group comprising Ib, IIb, IIIb, IVa and VIIIa group of the Periodic Table and oxygen. The element $\gamma$ is copper in general.

Particularly, the superconducting thin film is preferably a compound oxide represented by the general formula:

$$(\alpha_{1-x}\beta_x)Cu_yO_z$$

in which $\alpha$ and $\beta$ means the same definiion as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfy ranges of $0.4 \leq y \leq 3.0$ and $1 \leq z \leq 5$ respecively.

According to a preferred embodiment of the present invention, the element $\alpha$ is Ba or Sr and the elment $\beta$ is at least one element selected from a group comprising Y, La, Gd, Dy, Ho, Er, Tm, Yb, Nd, Sm, Eu and Lu. From 10 to 80% of the element $\alpha$ may be substituted by one or more than one of other elements selected from IIa group of the Periodic Table. The element $\beta$ may be a combination of more than two other elements selected from IIIa group of the Periodic. A portion of these components may be substituted if necessary by at least one of elements selected from a group comprising Al, Fe, Co, Ni, Zn, Ag and Ti.

An atomic ratio of $\alpha$ to $\beta$ depends on the type or system of the compound oxide or on the combination of $\alpha$ and $\beta$. For example, following atomic ratios are preferably used in case of Ba-Y system and Ba-La system respectively:

Y/(Y+Ba): 0.06 to 0.94, more preferably 0.1 to 0.4
Ba/(La+Ba): 0.04 to 0.96, more preferably 0.08 to 0.45

Thus, the preferable compound oxides are Y-Ba-Cu-O system, La-Ba-Cu-O system and La-Sr-Cu-O system including the following special cases:

$Y_1Ba_2Cu_3O_{7-x}$, $Ho_1Ba_2Cu_3O_{7-x}$, $Lu_1Ba_2Cu_3O_{7-x}$, $Sm_1Ba_2Cu_3O_{7-x}$, $Nd_1Ba_2Cu_3O_{7-x}$, $Gd_1Ba_2Cu_3O_{7-x}$, $Eu_1Ba_2Cu_3O_{7-x}$, $Er_1Ba_2Cu_3O_{7-x}$, $Dy_1Ba_2Cu_3O_{7-x}$, $Tm_1Ba_2Cu_3O_{7-x}$, $Yb_1Ba_2Cu_3O_{7-x}$, $La_1Ba_2Cu_3O_{7-x}$,
$(La,Sr)_2CuO_{4-x}$ in which x is a number which satisfies a range of $0 < x < 1$.

The abovementioned compound oxides possess preferably perovskite type or quasi-perovskite type crystal structure. The term of quasi-peroviskite type means a structure which can be considered to have such a crystal structure that is similar to Perovskite-type oxides and includes an orthorhombically distorted perovskite or a distorted oxygen-deficient perovskie or the like.

The superconducting thin film may be also another type of superconductor consisting mainly of a compound oxide represented by the formula:

$$\Theta_4(\Phi_{1-q}Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 < q < 1$, and r is a number which satisfies a range of $-2 \leq r \leq +2$. This system is considered to be a single phase of the following compound oxide or a mixed phase consisting mainly thereof:

$Bi_4Sr_4Ca_4Cu_6O_{20-r}$, $Bi_2Sr_2Ca_2Cu_3O_{10-r}$,
$Tl_4Ba_4Ca_4Cu_6O_{20-r}$, $Tl_2Ba_2Ca_2Cu_3O_{10-r}$, in which r is a number which satisfies a range of $-2 \leq r \leq +2$.

The substrate may be made of glass, quartz, silicon, sapphire, stainless steel or other ceramics. Particularly, the substrate consists preferably of a single crystal of MgO or $SrTiO_3$. Desirably, the superconducting thin film is deposited on a {001} plane or {110} plane of a single crystal of MgO or $SrTiO_3$ to improve the critical current density (Jc) owing to ordering of crystal to c-axis.

The thin film of superconductor can be prepared by the conventional physical vapour deposition technique, such as sputtering, vacuum deposition, ion plating, molecular beam epitaxial growth or the like. It is also possible to use chemical deposition technique (CVD) such as plasma CVD or photo CVD.

In operation, the thin film of compound oxide is prepared by sputtering technique and then a protective layer is applied on a surface of the superconducting thin film deposited. Such superconductig thin film can be prepared by sputtering technique described in our co-pending U.S. patent Ser. No. 152,714 filed on May 2, 1988.

In case of PVD, a vapour source may be elements of $\alpha$, $\beta$ and $\gamma$ themselves, oxides or carbonates thereof. An atomic ratio of these elements in the vapour source is adjusted in function of evaporation rates of these elements on the basis of an atom ratio of these elements in the thin film to be produced. For example, the atomic ration of the elements $\alpha$, $\beta$ and $\gamma$ in the vapor source is preferably selected from following range for typical compound oxide systems:

Y/(Y+Ba): 0.06 to 0.94, more preferably 0.1 to 0.4
Ba/(La+Ba): 0.04 to 0.96, more preferably 0.08 to 0.45

The vapour source may be a sintered mass or a powder which is prepared by pulverizing the sintered mass which is prepared, for example by sintering a powder mixture of $Y_2O_3$, CuO and $BaCUO_2$ and which may have a crystal structure of perovskite or quasi-perovskite type. The sintering can be carried out, for example at a temperature selected in the following range:

Y/(Y+Ba): 220° to 1,230° C.
Ba/(La+Ba): 234° to 1,260° C.

The vapour source may be divided into more than two segments, for example two segments consisting of a copper target and a target composed of Ba-Y compound oxide or three targets consisting of Cu, Y and Ba.

The superconducting property can be improved by heat-treatment which is effected in oxygen containing atmosphere after the thin film of compound oxide is deposited on the substrate. The heat-treatment is preferably effected under a partial pressure of oxygen ranging from 0.1 to 150 atm at a temperature between 300° and 1,500° C. After this temperature is maintained for more than one hour, the resulting thin film is cooled slowly at a rate of less than 100° C./min, preferably at a rate of less than 10° C./min. Advantage of the heat-treatment can not be obtained if the heat-treatment is effected outside the abovementioned conditions. For example, if the thin film is heated at a temperature which is higher than 1,500° C. the abovementioned advantage can not be obtained but the superconductivity will be disappeared. In case of the compound oxide type superconductor, oxygen deficiency in its crystal is a critical factor for realizing the superconductivity, so that the heat-treatment under a relatively higher partial pressure of oxygen is very preferable and is considered to be indispensable to realize superior superconductivity.

However, it is impossible to prevent the thin film of compound oxide from deterioration which occur during storage even if the thin film is heat-treatment completely. The deterioration of superconductivity, in other words a phenomenon that the superconducting property is lost gradually in time may be caused by disappearance or liberation of oxygen in the crystal because the superconductivity of compound oxide is observed in unstable or quasi-stable phase. This is a big problem of compound oxide type superconductors in their actual use.

This problem is solved by the present invention in which an outer surface of the thin film of superconductor is covered by a protective layer of chemically stable polymer compound which can be applied at a relatively low temperature and which has a high density to prevent oxygen from escaping from its crystal structure.

It is apparent from the description abovementioned that the superconducting thin film of compound oxide according to the present invention have improved stability than conventional superconducting thin film and hence they can be utilized advantageously in applications of thin film devices, such as Matisoo switching elements or Josephson device, Anacker memory device or Superconducting Quantum Interference Device (SQUID).

Now, several embodiments of the method according to the present invention will be described by Examples, but the scope of the present invention should not be limited thereto.

In the following Examples, two series of samples are prepared in such manner that the first series possesses the protective layer of polymer while second series do not possess the same.

EXAMPLE 1

Powders of $Y_2O_3$ and $BaCO_3$ are mixed in an atomic ratio of Y:Ba=1:2. Then, a powder of CuO is added to the resulting powder mixture in a proportion which is 10% excess with respect to an atomic ratio of Y:Ba:Cu=1:2:3. The resulting powder mixture is sintered at 950° C. to obtain a sintered block of $YBa_2Cu_3O_7$ which will be used as a target for a superconducting thin film.

The resulting target is set on a target holder and a substrate (100 mm Φ) consisting of a single crystal of MgO is secured on a substrate holder in such manner that the its surface on which the thin film is deposited has a {001} plane.

After a chamber 1 is vacuumed, argon gas with a partial pressure of $5.0 \times 10^{-2}$ Torr and oxygen gas with a partial pressure of $1.0 \times 10^{-2}$ Torr are introduced and the substrate is heated at 670° C. Then, the magnetron electrode is energized with high frequency of 3 W/cm² to prepare a thin film of compound oxide of 1 μm on the substrate at a film-forming rate of 0.50 Å/sec.

After deposition of the thin film of compound oxide complete, the deposited thin film is left in an atmosphere of oxygen having a partial pressure of 1 atom for 15 hour with heating the substrate at 650° C. and then cooled slowly at a cooling rate of 7° C./min.

After the heat-treatment, a surface of the thin film is coated with polyimide (Dupont) by spin-coating technique and cured at 300° C. for 30 minute to form a polyimide protective layer of 5 μm.

Resistance of the resulting thin film is measured on a sample on which aluminum electrodes are vacuum-deposited at opposite ends of the thin film of compound oxide deposited on the substrate.

Measurement of the critical temperature Tc and Tcf was carried out by a conventional four probe method in which the sample was immersed in liquidized helium to cool the sample down to a temperature of 8K in a cryostat. Then, the temperature depedence of resistance of the sample was determined with rising the temperature gradually to determine a temperature of Tcf at which the perfect superconductivity start to be lost and a resistance begin to appear and a temperature of Tc at which the superconductivity is lost and an ordinary resistance begin to appear.

Changes of Tcf and Tc are determined by comparing two values observed on same sample just after the protective layer is deposited and after one month.

The result as well as main operational parameters are shown in Table 1.

EXAMPLE 2

The same procedure as Example 1 is repeated except that a sintered block of $LaBa_2Cu_3O_7$ is used as a target for a thin film of compound oxide which is prepared by following procedure:

Powders of $La_2O_3$ and $BaCO_3$ were mixed at an atomic ratio of La:Ba=1:2 and then a powder of CuO was added to the resulting powder mixture in 10% excess of an atomic ratio of La:Ba:Cu=1:2:3. Then, the resulting powder mixture was sintered at 970° C. to obtain a sintered block of $LaBa_2Cu_3O_7$ which is used as a target for a superconducting thin film.

The result as well as main operational parameters are shown in Table 1.

TABLE 1

| No. | Partial pressure of $O_2$ (Torr) | Temperature of Substrate (°C.) | Protective Layer | Just after deposition Tc (K) | Just after deposition Tcf (K) | One month later Tc (K) | One month later Tcf (K) |
|---|---|---|---|---|---|---|---|
| 1 | $1.0 \times 10^{-2}$ | 670 | polyimide | 85 | 69 | 86 | 68 |
|   |   |   | — | 83 | 68 | 22 | — |
| 2 | $7.0 \times 10^{-3}$ | 650 | polyimide | 58 | 38 | 57 | 38 |
|   |   |   | — | 58 | 39 | — | — |

(Note): Superconductivity is not observed in liquid helium

EXAMPLE 3

The same procedure as Example 1 is repeated except that the polyimide is replaced by epoxy resin (Shinetsu Kagaku) to form a protective layer of epoxy resin of about 1 mm.

The result as well as main operational parameters are shown in Table 2.

EXAMPLE 4

The same procedure as Example 2 is repeated except that the polyimide is replaced by epoxy resin (Shinetsu Kagaku) to form a protective layer of epoxy resin of about 1 mm.

The result as well as main operational parameters as shown in Table 2.

TABLE 2

| No. | Partial pressure of $O_2$ (Torr) | Temperature of Substrate (°C.) | Protective Layer | Just after deposition Tc (K) | Just after deposition Tcf (K) | One month later Tc (K) | One month later Tcf (K) |
|---|---|---|---|---|---|---|---|
| 3 | $8.0 \times 10^{-3}$ | 720 | epoxy | 89 | 77 | 97 | 78 |
|   |   |   | — | 90 | 75 | 21 | — |
| 4 | $5.0 \times 10^{-3}$ | 630 | epoxy | 48 | 31 | 42 | 33 |
|   |   |   | — | 42 | 31 | — | — |

(Note): Superconductivity is not observed in liquid helium

What is claimed are:

1. A superconducting thin film composed of high temperature compound oxide deposited on a substrate, characterized in that an outer surface of the superconducting thin film is covered with a protective layer which is composed of polymer compound selected from the group consisting of silicon resins, epoxy resins and polyimide resins.

2. A superconducting thin film set forth in claim 1, characterized in that said superconducting thin film is a thin film of compound oxide composed of at least one element $\alpha$ selected from IIa group of the Periodic Table, at least one element $\beta$ selected from IIIa group of the Periodic Table, at least one element $\gamma$ selected from a group comprising Ib, IIb, IIIb, IVb and VIIIa group of the Periodic Table and oxygen.

3. A superconducting thin film set forth in claim 2, characterized in that said superconducting thin film is a thin film of compound oxide represented by the formula:

$$(\alpha_{1-x}\beta_x)Cu_yO_z$$

in which $\alpha$ and $\beta$ means the same definition as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfy ranges of $0.4 \leq y \leq 3.0$ and $1 \leq z \leq 5$ respectively.

4. A superconducting thin film set forth in claim 3, characterized in that said element $\alpha$ is Ba and said element $\beta$ is at least one element selected from a group comprising Y, La, Gd, Dy, Ho, Er, Tm, Yb, Nd, Sm, Eu and Lu.

5. A superconducting thin film set forth in claim 3, characterized in that said compound oxide contains Ba, Y, Cu and at least one of element selected from a group comprising Al, Fe, Co, Ni, Zn, Ag and Ti.

6. A superconducting thin film set forth in claim 3, characterized in that said compound oxide contains Ba, La, Cu and at least one of element selected from a group comprising Al, Fe, Co, Ni, Zn, Ag and Ti.

7. A superconducting thin film set forth in claim 3, characterized in that said compound oxide contains Sr, La, Cu and at least one of element selected from a group comprising Al, Fe, Co, Ni, Zn, Ag and Ti.

8. A superconducting thin film set forth in claim 2, characterized in that said superconducting thin film has perovskite type or quasi-pervoskite type crystal structure.

9. A superconducting thin film set forth in claim 1, characterized in that said superconducting thin film is a thin film of compound oxide represented by the formula:

$$\Theta_4(\Phi_{1-q}, Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 < q < 1$, and r is a number which satisfies a range of $-2 \leq r \leq +2$.

10. A superconducting thin film set forth in claim 1, characterized in that said substrate is made of glass, quartz, silicon, sapphire, stainless steel or other ceramics.

11. A superconducting thin film set forth in claim 10, characterized in that said substrate is a single crystal of MgO or $SrTiO_3$.

12. A superconducting thin film set forth in claim 11, characterized in that said superconducting thin film is deposited on a {001} plane or {110} plane of a single crystal of MgO or $SrTiO_3$.

* * * * *

UNITED STATES PATENT AND TRADEMARK OFFICE
CERTIFICATE OF CORRECTION

PATENT NO. : 4,942,142

DATED : July 17, 1990

INVENTOR(S) : Hideo Itozaki, et al

It is certified that error appears in the above-identified patent and that said Letters Patent is hereby corrected as shown below:

Col. 8, claim 8, line 3, "quasi-pervoskite" should be --quasi-perovskite--.

Signed and Sealed this

Fifth Day of November, 1991

Attest:

HARRY F. MANBECK, JR.

Attesting Officer

Commissioner of Patents and Trademarks